US012666785B2

(12) United States Patent
Handa

(10) Patent No.: US 12,666,785 B2
(45) Date of Patent: Jun. 23, 2026

(54) LIGHT-EMITTING ELEMENT AND LIGHT-EMITTING DEVICE

(71) Applicant: SHARP KABUSHIKI KAISHA, Sakai City (JP)

(72) Inventor: Shinichi Handa, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 371 days.

(21) Appl. No.: 18/277,482

(22) PCT Filed: Mar. 10, 2021

(86) PCT No.: PCT/JP2021/009396
§ 371 (c)(1),
(2) Date: Aug. 16, 2023

(87) PCT Pub. No.: WO2022/190226
PCT Pub. Date: Sep. 15, 2022

(65) Prior Publication Data
US 2024/0155858 A1 May 9, 2024

(51) Int. Cl.
*H10K 50/115* (2023.01)
*H10K 102/00* (2023.01)

(52) U.S. Cl.
CPC ..... *H10K 50/115* (2023.02); *H10K 2102/351* (2023.02)

(58) Field of Classification Search
None
See application file for complete search history.

(56) References Cited

U.S. PATENT DOCUMENTS

2007/0273270 A1 11/2007 Jinde et al.
2007/0275266 A1 11/2007 Jinde et al.

FOREIGN PATENT DOCUMENTS

CN 111384274 A 7/2020
JP 2005-290998 A 10/2005
WO 2007138906 A1 12/2007

OTHER PUBLICATIONS

Machine Translation of CN 111384274 (Year: 2020).*

* cited by examiner

*Primary Examiner* — Anthony Ho
(74) *Attorney, Agent, or Firm* — ScienBiziP, P.C.

(57) ABSTRACT

A light-emitting element includes a first electrode, a second electrode, a first light-emitting layer and a second light-emitting layer provided between the first electrode and the second electrode and including the same quantum dots, and an intermediate layer provided between the first light-emitting layer and the second light-emitting layer.

20 Claims, 5 Drawing Sheets

10: VACUUM LEVEL

10: VACUUM LEVEL ------------------------------------------------------------

LIGHT-EMITTING ELEMENT AND LIGHT-EMITTING DEVICE

TECHNICAL FIELD

The disclosure relates to a light-emitting element and a light-emitting device.

BACKGROUND ART

PTL 1 discloses a device in which an interface layer formed of a metal oxide is provided between quantum dots (light-emitting layer) and a charge transport layer. The device disclosed in PTL 1 can suppress quenching occurring at an interface between the charge transport layer and the light-emitting layer by providing the interface layer.

CITATION LIST

Patent Literature

PTL 1: JP 2005-290998 A

SUMMARY

Technical Problem

In a configuration of the device disclosed in PTL 1 described above, it is necessary to increase the film thickness of the interface layer in order to maintain a sufficient distance between the light-emitting layer and the charge transport layer so that quenching does not occur. However, when the film thickness of the interface layer is increased, injection of holes into the light-emitting layer may be inhibited, or a voltage applied to the device may become higher than a desired voltage. For this reason, in the configuration of the device disclosed in PTL 1, it is difficult to increase the film thickness of the interface layer. Thus, the device disclosed in PTL 1 has a problem that quenching cannot be sufficiently suppressed.

An object of the disclosure is to provide a light-emitting element and a light-emitting device that can sufficiently suppress quenching.

Solution to Problem

A light-emitting element according to an aspect of the disclosure includes a first electrode, a second electrode, a first light-emitting layer and a second light-emitting layer both provided between the first electrode and the second electrode, the first light-emitting layer and the second light-emitting layer both including quantum dots being the same as each other, and an intermediate layer provided between the first light-emitting layer and the second light-emitting layer.

Further, a light-emitting device according to an aspect of the disclosure includes a thin film transistor, and a light-emitting element electrically connected to the thin film transistor and including a first electrode, a second electrode, a first light-emitting layer and a second light-emitting layer both provided between the first electrode and the second electrode, the first light-emitting layer and the second light-emitting layer both including quantum dots being the same as each other, and an intermediate layer provided between the first light-emitting layer and the second light-emitting layer.

DESCRIPTION OF EMBODIMENTS

Figure 1:
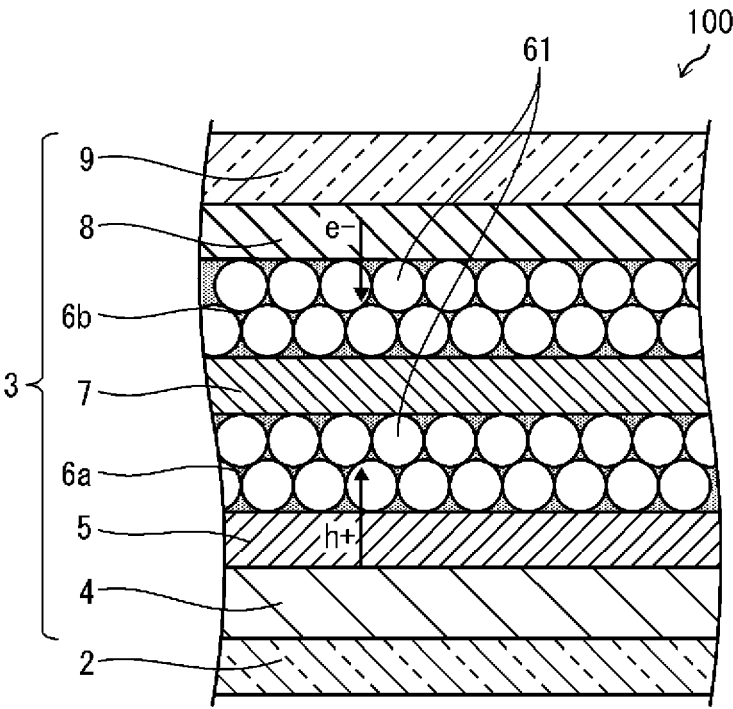
FIG. 1 is a schematic cross-sectional view of a light-emitting device according to an embodiment of the disclosure.

Embodiments of the disclosure will be described below with reference to the drawings. In each drawing, the same components are denoted by the same reference numerals and signs, and description thereof is omitted.

FIG. 1 is a schematic cross-sectional view of a light-emitting device 100 according to an embodiment of the disclosure. In FIG. 1, a direction from an array substrate 2 of the light-emitting device 100 toward a light-emitting element 3 may be described as an "upward direction", and an opposite direction may be described as a "downward direction".

The light-emitting device 100 is a device that can be used for a display of a television, a smartphone, or the like, for example. As illustrated in FIG. 1, the light-emitting device 100 includes the array substrate 2 and the light-emitting element 3. The array substrate 2 is a glass substrate on which a thin film transistor (TFT) (not illustrated) for driving the light-emitting element 3 is formed. In the light-emitting device 100, each layer of the light-emitting element 3 is layered on the array substrate 2, and the TFT of the array substrate 2 and the light-emitting element 3 are electrically connected to each other.

The light-emitting element 3 includes an anode 4 (first electrode), a hole transport layer 5 (first charge transport layer), a first light-emitting layer 6a, an intermediate layer 7, a second light-emitting layer 6b, an electron transport layer 8 (second charge transport layer), and a cathode 9 (second electrode). The light-emitting element 3 can be configured by layering the anode 4, the hole transport layer 5, the first light-emitting layer 6a, the intermediate layer 7, the second light-emitting layer 6b, the electron transport layer 8, and the cathode 9 on the array substrate 2 in this order from the bottom.

Anode

The anode 4 is formed on the array substrate 2 and is electrically connected to the TFT provided on the array substrate 2. The anode 4 is formed of a conductive material. Specifically, the anode 4 can be configured by layering a metal containing Al, Cu, Au, Ag, or the like functioning as a reflective layer and having high light reflectivity and a transparent conductive film of ITO, IZO, ZnO, AZO, or BZO functioning as a transparent electrode and having optical transparency. The anode 4 can be formed on the array substrate 2 by using, for example, sputtering or vapor deposition.

Hole Transport Layer

The hole transport layer 5 transports holes injected from the anode 4 to the first light-emitting layer 6a. The hole transport layer 5 is formed on the anode 4 and is electrically connected to the anode 4. The hole transport layer 5 may be formed of a material containing an inorganic oxide semiconductor such as NiO or MgNiO. The hole transport layer 5 can be formed using an organic material such as a conductive polymer or a mixture of an organic material and an inorganic material in addition to the inorganic oxide semiconductor materials described above.

However, in the light-emitting device 100 according to the embodiment, the hole transport layer 5 is formed using an inorganic material such as an inorganic oxide semiconductor material from the viewpoint of reliability of the light-emitting element 3. The reliability of the light-emitting element 3 means whether the light-emitting element 3 can emit light with constant luminance for a long time. The reliability of the light-emitting element 3 can be evaluated, for example, as a time-series change in the luminance of light emitted from the light-emitting element 3.

The hole transport layer 5 can be formed by, for example, a sputtering method, a vapor deposition method, a spin coating method, or an inkjet method.

First Light-Emitting Layer, Second Light-Emitting Layer

The first light-emitting layer 6a and the second light-emitting layer 6b are provided between the anode 4 and the cathode 9, more specifically, between the hole transport layer 5 and the electron transport layer 8. Each of the first light-emitting layer 6a and the second light-emitting layer 6b includes quantum dots 61 (semiconductor nanoparticles) and is configured such that one or more layers of the quantum dots 61 are layered. The term "quantum dot" as mentioned herein means that the maximum width of a dot is 1 nm or more and 100 nm or less. The shape of the quantum dot is not particularly limited as long as the maximum width thereof falls within a range satisfying the above, and the shape is not limited to a spherical three-dimensional shape (circular cross-sectional shape). The shape of the quantum dot may be, for example, a polygonal cross-sectional shape, a rod-shaped three-dimensional shape, a branch-shaped three-dimensional shape, or a three-dimensional shape having unevenness on the surface thereof, or a combination thereof. The first light-emitting layer 6a and the second light-emitting layer 6b include the same quantum dots. The term "same quantum dots" as mentioned herein means quantum dots used in a light-emitting layer constituting subpixels of the same color in the light-emitting device 100. That is, the light-emitting layer containing the same quantum dots is not limited to only a light-emitting layer containing quantum dots having completely the same material, composition, and average particle size, but is a light-emitting layer containing quantum dots having a composition and particle size that are usable in a range considered to constitute subpixels of the same color. The same color of the subpixels is the same color in the sense that the colors of the subpixels belong to any of a plurality of primary colors constituting a display image such as red, green, and blue. For this reason, the same color of the subpixels only requires that the colors of the subpixels be substantially the same within a range visible to human eyes, and it is not required that the peak of the wavelength of light be completely the same in a strict sense. For example, when two peaks are detected in a light emission wavelength spectrum of two types of quantum dots and the respective peak wavelengths are within the range of wavelengths of the same color of 430 nm to 500 nm representing blue, 500 nm to 570 nm representing green, and 610 nm to 780 nm representing red, it is assumed that the quantum dots are the same. Naturally, it is assumed that the quantum dots are also the same in a case where two peaks are not detected.

The quantum dot 61 is a light-emitting material that emits light by recombination of holes in a valence band level and electrons in a conduction band level. Since light emitted from the quantum dots 61 has a narrower spectrum due to a quantum confinement effect, it is possible to obtain light emission with relatively deep chromaticity.

The quantum dots 61 can be selected from the group consisting of a Group II-VI semiconductor compound, a Group III-V semiconductor compound, and a Group IV semiconductor compound. Examples of the Group II-VI semiconductor compound to be selected include MgS, MgSe, MgTe, CaS, CaSe, CaTe, SrS, SrSe, SrTe, BaS, BaSe, BaTe, ZnS, ZnSe, ZnTe, CdS, CdSe, CdTe, HgS, HgSe, and HgTe. As the Group III-V semiconductor compound, GaAs, GaP, GaN, InN, InAs, InP, InSb, and the like can be selected. As the Group IV semiconductor compound, Si, Ge, and the like can be selected. The Group II-VI semiconductor compound represents a compound containing a Group II element and a Group VI element, the Group III-V semiconductor compound represents a compound containing a Group III element and a Group V element, and the Group IV semiconductor compound represents a compound containing a Group IV element. The Group II element represents a Group 2 element or a Group 12 element, the Group III element represents a Group 3 element or a Group 13 element, the Group IV element represents a Group 4 element or a Group 14 element, the Group V element represents a Group 5 element or a Group 15 element, and the Group VI element represents a Group 6 element or a Group 16 element. Here, the numbering of groups by Roman numerals is numbering according to the old International Union of Pure and Applied Chemistry (IUPAC) or old Chemical Abstracts Service (CAS) system, and the numbering of groups by Arabic numerals is numbering according to the current IUPAC system.

The quantum dots 61 may be, for example, semiconductor nanoparticle including a core/shell structure such as CdSe/CdS, CdSe/ZnS, InP/ZnS, or ZnSe/ZnS. In addition, a ligand formed of an inorganic material or an organic material may be coordinately bonded to the outer peripheral portion of the shell in order to inactivate defects on the surface of the shell and to improve dispersibility in a coating solvent.

Incidentally, in the light-emitting element 3 according to the embodiment, holes and electrons are recombined mainly at an interface between the first light-emitting layer 6a and the intermediate layer 7 or an interface between the second light-emitting layer 6b and the intermediate layer 7 to emit light. A range in which light is mainly emitted is a range of approximately 5 nm from the interface between the intermediate layer 7 and the first light-emitting layer 6a and the interface between the intermediate layer 7 and the second light-emitting layer 6b. Thus, when a distance from the interface between the first light-emitting layer 6a and the intermediate layer 7 to the hole transport layer 5 and a distance from the interface between the second light-emitting layer 6b and the intermediate layer 7 to the electron transport layer 8 are larger than 5 nm, the occurrence of quenching can be suppressed.

Thus, it is preferable that the film thickness of each of the first light-emitting layer 6a and the second light-emitting layer $6b$ be larger than 5 nm. In order to enhance the effect of suppressing the occurrence of quenching, the film thickness of each of the first light-emitting layer $6a$ and the second light-emitting layer $6b$ is set to be 10 nm or more, more preferably 20 nm or more. On the other hand, when the film thicknesses of the first light-emitting layer $6a$ and the second light-emitting layer $6b$ are excessively large, electric resistance of both layers increases, and a voltage applied between the anode 4 and the cathode 9 increases. For this reason, it is preferable that the film thickness of each of the first light-emitting layer $6a$ and the second light-emitting layer $6b$ be set to be 40 nm or less based on the magnitude of a drive voltage applied to the light-emitting device 100 when the light-emitting device 100 is used in, for example, a display. From the viewpoint of suppressing the drive voltage, the film thickness of each of the first light-emitting layer $6a$ and the second light-emitting layer $6b$ is more preferably 30 nm or less, and is further preferably as thin as 25 nm or less, 20 nm or less, 15 nm or less, 10 nm or less, and 5 nm or less.

The film thickness of each of the first light-emitting layer $6a$ and the second light-emitting layer $6b$ is preferably in a range of greater than 5 nm and 40 nm or less, more preferably in a range of 10 nm or more and 40 nm or less, and further preferably in a range of 20 nm or more and 40 nm or less. The film thickness of each of the first light-emitting layer $6a$ and the second light-emitting layer $6b$ is set to the above-described numerical values in a single layer to exhibit an effect in the single layer, and the film thickness can be individually set in each of the layers. It is preferable that the first light-emitting layer $6a$ and the second light-emitting layer $6b$ have approximately the same film thickness.

Intermediate Layer

The intermediate layer 7 is formed of a material having a larger ionization potential and a smaller electron affinity than those of the first light-emitting layer $6a$ and the second light-emitting layer $6b$. In other words, the intermediate layer 7 is formed of a material that serves as an energy barrier for both electrons and holes. The intermediate layer 7 is preferably configured to suppress conduction of electrons and holes, and is further preferably formed of a material that suppresses the occurrence of quenching or does not cause quenching. The suppression of conduction of electrons and holes means that, for example, as described above, the intermediate layer 7 has a larger ionization potential or a smaller electron affinity than those of the first light-emitting layer $6a$ and the second light-emitting layer $6b$, thereby generating an energy barrier and blocking injection of charges from the first light-emitting layer $6a$ or the second light-emitting layer $6b$ to the intermediate layer 7. For example, the resistivity of the intermediate layer 7 is increased by lowering carrier mobility or carrier concentration as compared with the first light-emitting layer $6a$ and the second light-emitting layer $6b$. As the material forming the intermediate layer 7, an organic material or a mixture of an organic material and an inorganic material can also be used. However, in the light-emitting device 100 according to the embodiment, the intermediate layer 7 is formed using an inorganic material such as an inorganic oxide semiconductor material from the viewpoint of reliability of the light-emitting element 3.

Specifically, the intermediate layer 7 contains at least one selected from the group consisting of a metal oxide and a metal halide. It is preferable that the metal oxide contain at least one selected from the group consisting of $Al_2O_3$, $SiO_2$, $MgO$, $ZrO_2$, $HfO_2$, $Cr_2O_3$, $Ga_2O_3$ and $Ta_2O_5$. It is preferable that the metal halide contain at least one selected from the group consisting of LiF, $BaF_2$, $CaF_2$, $MgF_2$, NaF, NaCl, $CdF_2$, $CdCl_2$, $CdBr_2$, $CdI_2$, $ZnF_2$, $ZnCl_2$, $ZnBr_2$, and $ZnI_2$.

In this manner, the intermediate layer 7 contains at least one selected from the group consisting of a metal oxide and a metal halide, and thus the intermediate layer 7 is relatively stable against oxygen and moisture and is less likely to deteriorate. For this reason, the light-emitting element 3 can obtain high reliability. Although details will be described later, the intermediate layer 7 has a band gap larger than those of the first light-emitting layer $6a$ and the second light-emitting layer $6b$. For this reason, in the light-emitting element 3, by suppressing the conduction of electrons and holes, it is possible to strike a carrier balance between holes and electrons recombined in the first light-emitting layer $6a$ or a carrier balance between holes and electrons recombined in the second light-emitting layer $6b$.

The film thickness of the intermediate layer 7 is preferably 0.5 nm or more in order to obtain an effect of suppressing conduction of electrons and holes. As the film thickness of the intermediate layer 7 increases, electric resistance between the anode 4 and the cathode 9 increases. Consequently, an upper limit of the film thickness of the intermediate layer 7 can be determined based on the magnitude of a drive voltage applied to the light-emitting device 100 when the light-emitting device 100 is used in, for example, a display. For example, the upper limit of the film thickness of the intermediate layer 7 may be 20 nm or less, and the film thickness is further preferably as thin as 15 nm or less, 10 nm or less, and 5 nm or less from the viewpoint of reducing the drive voltage.

Here, the thickness of the intermediate layer 7 is the maximum thickness of the intermediate layer at any cut surface obtained by cutting the intermediate layer in the thickness direction of the intermediate layer. The thickness of the intermediate layer can be measured, for example, by observing a cross-section of the intermediate layer using a scanning electron microscope (SEM), a transmission electron microscope (TEM), or the like.

The intermediate layer 7 does not necessarily need to be provided in the entire region where the first light-emitting layer $6a$ and the second light-emitting layer $6b$ overlap each other. The intermediate layer does not necessarily need to cover the entire surface of each of the light-emitting layers. The intermediate layer includes that formed in a layered manner on at least a part of a region where the first light-emitting layer and the second light-emitting layer overlap each other. Thus, even when the intermediate layer is provided, the intermediate layer may not be interposed between the first light-emitting layer and the second light-emitting layer, and there may be a portion where the first light-emitting layer and the second light-emitting layer are opposing without the intermediate layer being interposed therebetween.

Specifically, the intermediate layer may be constituted by, for example, a plurality of island-shaped intermediate layers provided between the first light-emitting layer and the second light-emitting layer. For example, a plurality of through-holes penetrating the intermediate layer in the thickness direction may be formed in the intermediate layer.

In any cross-section in the thickness direction of the intermediate layer 7, the intermediate layer covers preferably 10% or more, more preferably 30% or more, further preferably 50% or more, still further preferably 70% or more, still yet further preferably 90% or more, and most preferably 100% of the surface of the first light-emitting layer or the second light-emitting layer. The covering 100% of the surface as mentioned herein means that there is a portion continuously covering 1 μm of the surface in terms of the width in a direction perpendicular to the thickness direction. That is, in order to satisfy the above numeric percentage values, it is sufficient to measure the width in a 1 μm range in a direction perpendicular to the thickness direction of the intermediate layer and know that the numeric percentage values are satisfied.

The intermediate layer does not necessarily need to have a substantially uniform thickness, and the intermediate layer may have an uneven thickness such as irregularities.

Electron Transport Layer

The electron transport layer 8 is provided on the second light-emitting layer 6b and transports electrons injected from the cathode 9 into the second light-emitting layer 6b. The electron transport layer 8 can be formed of a material containing an inorganic semiconductor from the viewpoint of reliability. The electron transport layer 8 may contain, for example, at least one selected from the group consisting of $ZnO$, $ZnMgO$, $TiO_2$, $Ta_2O_3$, $SnO_2$ and $SrTiO_3$.

Each of the hole transport layer 5, the intermediate layer 7, and the electron transport layer 8 described above may be configured to contain nanoparticles, crystals, polycrystals, or amorphous.

Cathode

The cathode 9 is provided on the electron transport layer 8 and is electrically connected to the electron transport layer 8. The cathode 9 is formed of a conductive material. The cathode 9 can be formed of, for example, a metal thinned to a degree having optical transparency, a nanoparticle-sized metal, or a transparent electrode. Examples of the metal constituting the cathode 9 include metals containing Al, Cu, Au, Ag, or the like. Examples of the transparent electrode constituting the cathode 9 may include ITO, IZO, ZnO, AZO, and BZO. The cathode 9 can be formed on the electron transport layer 8 by using, for example, a sputtering method, a vapor deposition method, a spin coating method, or the like.

In the light-emitting device 100 having the configuration described above, holes (arrow $h^+$ in FIG. 1) injected from the anode 4 are transported to the first light-emitting layer 6a via the hole transport layer 5. Electrons (arrow $e^-$ in FIG. 1) injected from the cathode 9 are transported to the second light-emitting layer 6b via the electron transport layer 8. The holes transported to the first light-emitting layer 6a and the electrons injected into the first light-emitting layer 6a beyond the intermediate layer 7 among the electrons transported to the second light-emitting layer 6b are recombined in the quantum dots 61 to generate excitons. Alternatively, the electrons transported to the second light-emitting layer 6b and the holes injected into the second light-emitting layer 6b beyond the intermediate layer 7 among the holes transported to the first light-emitting layer 6a are recombined in the quantum dots 61 to generate excitons. Then, the excitons return from an excited state to a ground state, and thus the quantum dots 61 emit light.

FIG. 1 illustrates a top-emission light-emitting device 100 in which light emitted from at least one of the first light-emitting layer 6a and the second light-emitting layer 6b is extracted from a side opposite to the array substrate 2 (upper side in FIG. 1). However, the light-emitting device 100 may be a bottom-emission type in which light is extracted from the array substrate 2 side (lower side in FIG. 1). When the light-emitting device 100 has a bottom-emission type structure, the cathode 9 is a reflective electrode, and the anode 4 is a transparent electrode.

The light-emitting device 100 according to the first embodiment is configured such that the anode 4, the hole transport layer 5, the first light-emitting layer 6a, the intermediate layer 7, the second light-emitting layer 6b, the electron transport layer 8, and the cathode 9 are layered on the array substrate 2 in this order from the bottom. However, the light-emitting device 100 may have a so-called invert structure in which the cathode 9, the electron transport layer 8, the second light-emitting layer 6b, the intermediate layer 7, the first light-emitting layer 6a, the hole transport layer 5, and the anode 4 are layered on the array substrate 2 in this order from the bottom.

As described above, in the light-emitting device 100 according to the embodiment, the hole transport layer 5 is formed using an inorganic material such as an inorganic oxide semiconductor material from the viewpoint of reliability of the light-emitting element 3. As described above, when the hole transport layer 5 is formed of an inorganic oxide semiconductor material, the following problems occur in a light-emitting element that does not include the intermediate layer 7.

The amount of holes transported from the hole transport layer to the light-emitting layer tends to become smaller than the amount of electrons transported from the electron transport layer to the light-emitting layer, and excitons tend to be generated in the vicinity of the interface between the hole transport layer and the light-emitting layer to emit light. However, excitons are separated into electrons and holes in the vicinity of the interface between the hole transport layer and the light-emitting layer by an —OH group contained in the oxide constituting the hole transport layer or by a strong electrical field generated by a dipole of a dangling bond, whereby quenching is likely to occur.

Consequently, in the light-emitting device 100 according to the present embodiment, the intermediate layer 7 is provided between the first light-emitting layer 6a and the second light-emitting layer 6b. Thereby, light is mainly emitted at or in the vicinity of an interface between the first light-emitting layer 6a and the intermediate layer 7, or at or in the vicinity of an interface between the second light-emitting layer 6b and the intermediate layer 7, and the occurrence of quenching can be suppressed by separating a light-emitting region from the hole transport layer 5.

Figure 2:
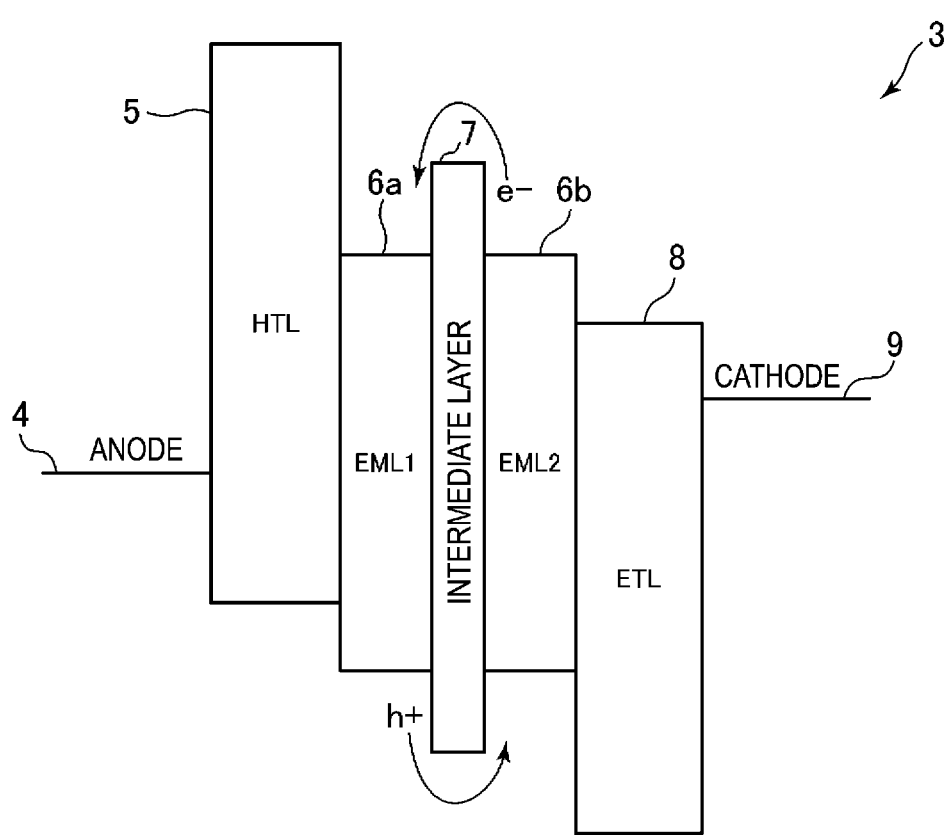
FIG. 2 is an energy diagram illustrating a relationship of an electron affinity and an ionization potential between layers of the light-emitting element according to the embodiment of the disclosure.

Next, an energy relationship between the first light-emitting layer 6a, the second light-emitting layer 6b, and the intermediate layer 7 will be described with reference to FIG. 2. FIG. 2 is an energy diagram illustrating a relationship of an electron affinity and an ionization potential between layers of the light-emitting element 3 according to the embodiment of the disclosure. FIG. 2 illustrates a state where the hole transport layer 5, the first light-emitting layer 6a, the second light-emitting layer 6b, the intermediate layer 7, and the electron transport layer 8 are independent of each other.

As illustrated in FIG. 2, the anode 4, the hole transport layer 5, the first light-emitting layer 6a, the intermediate layer 7, the second light-emitting layer 6b, the electron transport layer 8, and the cathode 9 are disposed from left to right. In this specification, the hole transport layer 5, the first light-emitting layer 6a, the second light-emitting layer 6b, and the electron transport layer 8 are respectively denoted by HTL, EML1, EML2, and ETL in the drawings.

In the energy diagram, the anode 4 and the cathode 9 are represented by work functions. A lower end of each of the hole transport layer 5, the first light-emitting layer 6a, the second light-emitting layer 6b, the intermediate layer 7, and the electron transport layer 8 is equivalent to an uppermost portion of a valance band (VBM) and indicates an ionization potential of each of the layers with respect to a vacuum level 10. VBM is equivalent to a highest occupied molecular orbital (HOMO) of a molecule.

An upper end of each of the hole transport layer 5, the first light-emitting layer 6a, the second light-emitting layer 6b, the intermediate layer 7, and the electron transport layer 8 is equivalent to a lowest portion of a lower end of a conduction band (CBM) and indicates an electron affinity of each of the layers with respect to the vacuum level 10. CBM is equivalent to a lowest unoccupied molecular orbital (LUMO) of a molecule. In the following description, both an ionization potential and an electron affinity are assumed to be described based on the vacuum level 10 when they are described simply.

As described above, the first light-emitting layer 6a and the second light-emitting layer 6b include the same quantum dots. The same quantum dots are quantum dots within a wavelength range in which emission colors thereof exhibit blue, green, and red, and here, are quantum dots having the same material, composition, and average particle size. For this reason, as illustrated in FIG. 2, the first light-emitting layer 6a and the second light-emitting layer 6b have the same ionization potential and electron affinity.

On the other hand, the intermediate layer 7 sandwiched between the first light-emitting layer 6a and the second light-emitting layer 6b has a larger ionization potential and a smaller electron affinity than those of the first light-emitting layer 6a and the second light-emitting layer 6b. That is, the intermediate layer 7 serves as an energy barrier for holes conducted from the first light-emitting layer 6a to the second light-emitting layer 6b and electrons conducted from the second light-emitting layer 6b to the first light-emitting layer 6a. For this reason, holes are likely to be accumulated in the vicinity of the interface between the intermediate layer 7 and the first light-emitting layer 6a, and electrons are likely to be accumulated in the vicinity of the interface between the intermediate layer 7 and the second light-emitting layer 6b. Among the holes accumulated in the first light-emitting layer 6a, holes having moved to the second light-emitting layer 6b over the intermediate layer 7 are recombined at or in the vicinity of the interface between the intermediate layer 7 and the second light-emitting layer 6b to emit light. On the other hand, among the electrons accumulated in the second light-emitting layer 6b, electrons having moved to the first light-emitting layer 6a over the intermediate layer 7 are recombined at or in the vicinity of the interface between the intermediate layer 7 and the first light-emitting layer 6a to emit light.

As described above, in the light-emitting element 3 according to the embodiment, the film thickness of each of the first light-emitting layer 6a and the second light-emitting layer 6b is greater than 5 nm, preferably 10 nm or more, and more preferably 20 nm or more. For this reason, at least a distance from the center of light emission in the first light-emitting layer 6a to the hole transport layer 5 can be set to be larger than 5 nm. At least a distance from the center of light emission in the second light-emitting layer 6b to the electron transport layer 8 can be set to be larger than 5 nm. Here, in the light-emitting element 3, light is mainly emitted in a range of approximately 5 nm from the interface between the intermediate layer 7 and the first light-emitting layer 6a and in a range of approximately 5 nm from the interface between the intermediate layer 7 and the second light-emitting layer 6b.

Thus, in the light-emitting element 3, a light-emitting region where light emission occurs can be physically separated from the hole transport layer 5 or the electron transport layer 8 which causes quenching, and thus it is possible to suppress the occurrence of quenching and to improve luminance efficiency.

Incidentally, the light-emitting device 100 operates for a long period of time, and thus injection of holes into the first light-emitting layer 6a or injection of electrons into the second light-emitting layer 6b may be reduced. When the injection of holes or electrons is reduced and a carrier balance between holes and electrons is deteriorated as described above, there is a problem in that Auger recombination occurs to cause a reduction in luminance and a reduction in luminous efficiency.

However, since the light-emitting element 3 according to the embodiment includes the intermediate layer 7, the occurrence of the Auger recombination can be suppressed even when injection of charge into the light-emitting layer is reduced. For example, it is assumed that injection of holes from the hole transport layer 5 to the first light-emitting layer 6a is reduced. In this case, in the light-emitting element 3 according to the embodiment, injection of electrons into the first light-emitting layer 6a can be suppressed by the intermediate layer 7. For this reason, in the first light-emitting layer 6a, it is possible to stably emit light while suppressing deterioration of a carrier balance between holes and electrons.

On the other hand, since injection of holes into the second light-emitting layer 6b is further reduced by the intermediate layer 7, recombination of holes and electrons is suppressed, and the second light-emitting layer 6b does not emit light. In the second light-emitting layer 6b, recombination of holes and electrons is suppressed and light is not emitted, and thus Auger recombination does not occur.

Although not illustrated in FIGS. 1 and 2, the light-emitting element 3 may further include a hole injection layer between the anode 4 and the hole transport layer 5. The light-emitting element 3 may further include an electron injection layer between the cathode 9 and the electron transport layer 8.

Modification Example 1

Figure 3:
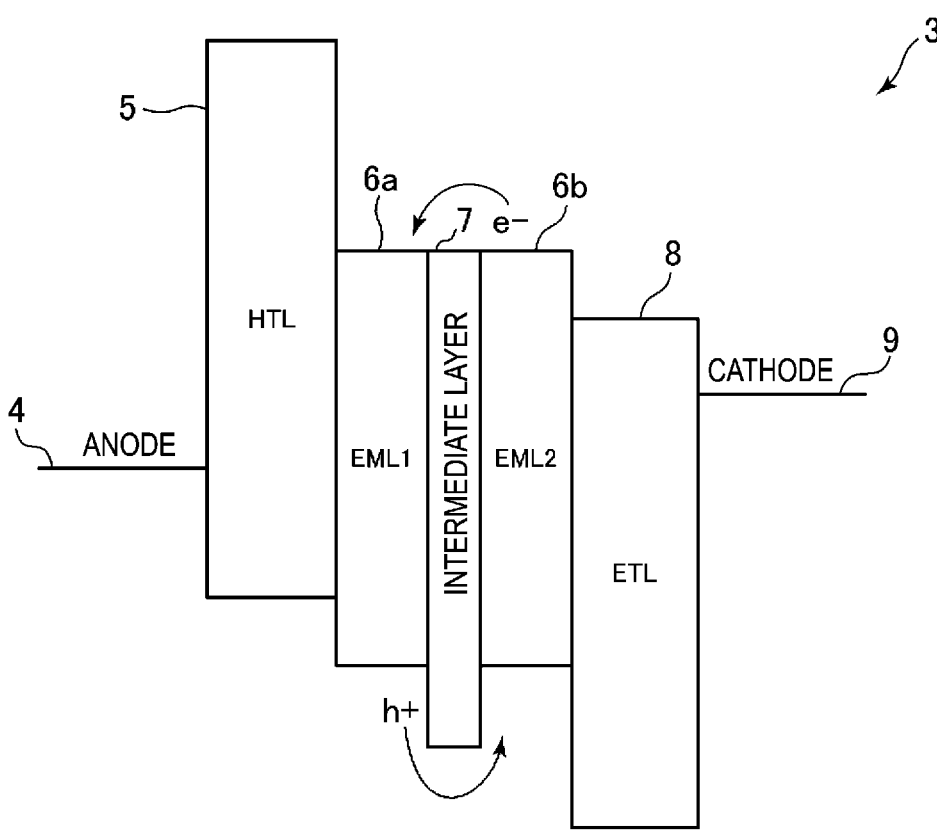
FIG. 3 is an energy diagram illustrating a relationship of an electron affinity and an ionization potential between layers of a light-emitting element according to Modification Example 1 of the embodiment of the disclosure.

Next, a light-emitting device 100 according to Modification Example 1 of the embodiment will be described with reference to FIG. 3. FIG. 3 is an energy diagram illustrating a relationship of an electron affinity and an ionization potential between layers of a light-emitting element 3 according to Modification Example 1 of the embodiment of the disclosure. For convenience of description, FIG. 3 illustrates a state where a hole transport layer 5, a first light-emitting layer 6a, a second light-emitting layer 6b, an intermediate layer 7, and an electron transport layer 8 are independent of each other.

The light-emitting device 100 according to Modification Example 1 of the embodiment has the same configuration as that of the light-emitting device 100 of the embodiment except that magnitudes of an ionization potential and an electron affinity of the intermediate layer 7 are different as follows.

That is, in the light-emitting element 3 according to the embodiment, the intermediate layer 7 is formed of a material having a larger ionization potential and a smaller electron affinity than those of the first light-emitting layer 6a and the second light-emitting layer 6b. On the other hand, in the light-emitting device 100 according to Modification Example 1 of the embodiment, the intermediate layer 7 is formed of a material having at least an ionization potential larger than those of the first light-emitting layer 6a and the second light-emitting layer 6b. An electron affinity may be larger than those of the first light-emitting layer 6a and the second light-emitting layer 6b. That is, in the light-emitting element 3, when the amount of holes injected into the first light-emitting layer 6a is excessively larger than the amount of electrons injected into the second light-emitting layer 6b, the intermediate layer 7 serves as an energy barrier, and thus it is possible to suppress movement of holes from the first light-emitting layer 6a to the second light-emitting layer 6b as illustrated in FIG. 3.

For this reason, in the light-emitting element 3 according to Modification Example 1 of the embodiment, it is possible to strike a carrier balance between holes and electrons that are recombined in the second light-emitting layer 6b in a configuration in which an excessively large amount of holes are injected.

As a material having a larger ionization potential than those of the first light-emitting layer 6a and the second light-emitting layer 6b, for example, ZnO, ZnMgO, TiO$_2$, SnO$_3$, WO$_3$, MoO$_3$, and V$_2$O$_5$ can also be used in addition to the above-described metal oxides and metal halides.

Modification Example 2

Figure 4:
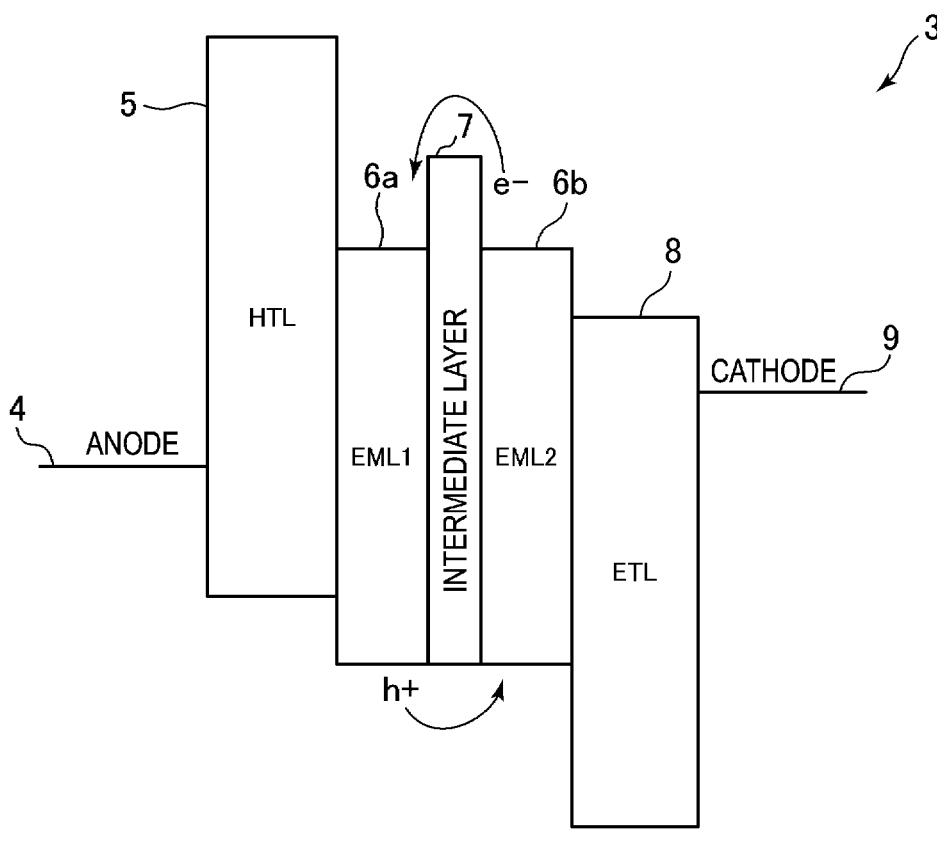
FIG. 4 is an energy diagram illustrating a relationship of an electron affinity and an ionization potential between layers of a light-emitting element according to Modification Example 2 of the embodiment of the disclosure.

Next, a light-emitting device 100 according to Modification Example 2 of the embodiment will be described with reference to FIG. 4. FIG. 4 is an energy diagram illustrating a relationship of an electron affinity and an ionization potential between layers of a light-emitting element 3 according to Modification Example 2 of the embodiment of the disclosure. For convenience of description, FIG. 4 illustrates a state where a hole transport layer 5, a first light-emitting layer 6a, a second light-emitting layer 6b, an intermediate layer 7, and an electron transport layer 8 are independent of each other.

The light-emitting device 100 according to Modification Example 2 of the embodiment has the same configuration as that of the light-emitting device 100 of the embodiment except that magnitudes of an ionization potential and an electron affinity of the intermediate layer 7 are different as follows.

That is, in the light-emitting element 3 according to the embodiment, the intermediate layer 7 is formed of a material having a larger ionization potential and a smaller electron affinity than those of the first light-emitting layer 6a and the second light-emitting layer 6b. On the other hand, in the light-emitting device 100 according to Modification Example 2 of the embodiment, the intermediate layer 7 is formed of a material having at least an electron affinity smaller than those of the first light-emitting layer 6a and the second light-emitting layer 6b. An ionization potential may be smaller than those of the first light-emitting layer 6a and the second light-emitting layer 6b. That is, in the light-emitting element 3, when the amount of electrons injected into the second light-emitting layer 6b is excessively larger than the amount of holes injected into the first light-emitting layer 6a, the intermediate layer 7 serves as an energy barrier, and thus it is possible to suppress movement of electrons from the second light-emitting layer 6b to the first light-emitting layer 6a as illustrated in FIG. 4.

For this reason, in the light-emitting element 3 according to Modification Example 2 of the embodiment, it is possible to strike a carrier balance between holes and electrons that are recombined in the first light-emitting layer 6a in a configuration in which an excessively large amount of electrons are injected.

As a material having a smaller electron affinity than those of the first light-emitting layer 6a and the second light-emitting layer 6b, for example, NiO, MgNiO, LaNiO$_3$, CuO, Cu$_2$O, CuI, CuBr, and CuSCN can also be used in addition to the above-described metal oxides and metal halides.

Modification Example 3

Figure 5:
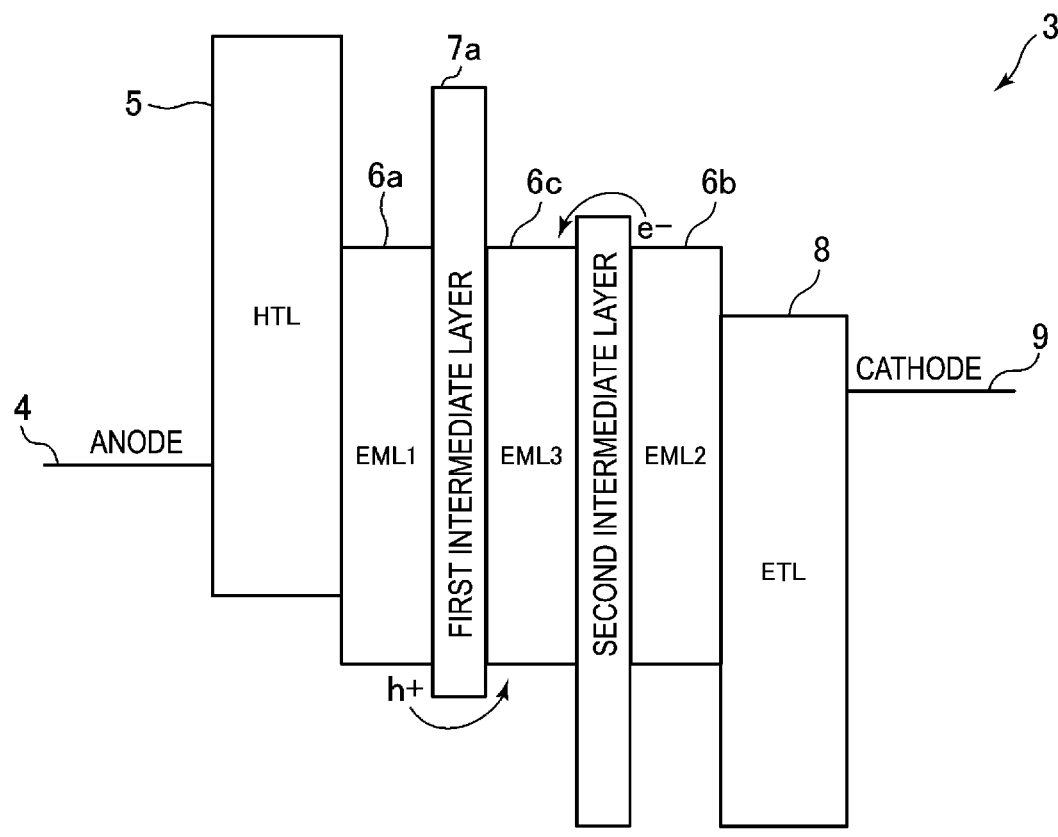
FIG. 5 is an energy diagram illustrating a relationship of an electron affinity and an ionization potential between layers of a light-emitting element according to Modification Example 3 of the embodiment of the disclosure.

Next, a light-emitting device 100 according to Modification Example 3 of the embodiment will be described with reference to FIG. 5. FIG. 5 is an energy diagram illustrating a relationship of an electron affinity and an ionization potential between layers of a light-emitting element 3 according to Modification Example 3 of the embodiment of the disclosure. For convenience of description, FIG. 5 illustrates a state where a hole transport layer 5, a first light-emitting layer 6a, a second light-emitting layer 6b, a third light-emitting layer 6c, a first intermediate layer 7a, a second intermediate layer 7b, and an electron transport layer 8 are independent of each other.

The light-emitting device 100 according to Modification Example 3 of the embodiment has the same configuration as that of the light-emitting device 100 of the embodiment except that the number of light-emitting layers and the number of intermediate layers are different. That is, the light-emitting element 3 according to the embodiment includes the first light-emitting layer 6a, the second light-emitting layer 6b, and the intermediate layer 7 between the hole transport layer 5 and the electron transport layer 8. On the other hand, the light-emitting element 3 according to Modification Example 3 of the embodiment further includes the third light-emitting layer 6c between the hole transport layer 5 and the electron transport layer 8, in addition to the first light-emitting layer 6a and the second light-emitting layer 6b. The intermediate layer 7 includes the first intermediate layer 7a and the second intermediate layer 7b.

Specifically, as illustrated in FIG. 5, the light-emitting element 3 according to Modification Example 3 includes the third light-emitting layer 6c containing the same quantum dots as the first light-emitting layer 6a and the second light-emitting layer 6b between the first light-emitting layer 6a and the second light-emitting layer 6b. The first intermediate layer 7a is provided between the first light-emitting layer 6a and the third light-emitting layer 6c, and the second intermediate layer 7b is provided between the third light-emitting layer 6c and the second light-emitting layer 6b.

The light-emitting element 3 according to Modification Example 3 is configured such that an anode 4, the hole transport layer 5, the first light-emitting layer 6a, the first intermediate layer 7a, the third light-emitting layer 6c, the second intermediate layer 7b, the second light-emitting layer 6b, and the electron transport layer 8 are layered in this order.

A relationship of an electron affinity and an ionization potential between in the first intermediate layer 7a and the second intermediate layer 7b and in the first light-emitting layer 6a, the second light-emitting layer 6b, and the third light-emitting layer 6c is as illustrated in FIG. 5. That is, the first intermediate layer 7a has an electron affinity smaller than those of the first light-emitting layer 6a and the third light-emitting layer 6c adjacent thereto. For this reason, the first intermediate layer 7a serves as an energy barrier against movement of electrons from the third light-emitting layer 6c to the first light-emitting layer 6a.

The second intermediate layer 7b has an ionization potential larger than those of the second light-emitting layer 6b and the third light-emitting layer 6c adjacent thereto. For this reason, the second intermediate layer 7b serves as an energy barrier against movement of holes from the third light-emitting layer 6c to the second light-emitting layer 6b. A relationship of an electron affinity and an ionization potential between the first intermediate layer 7a and the second intermediate layer 7b is as illustrated in FIG. 5. That is, the electron affinity and the ionization potential of the first intermediate layer 7a are smaller than the electron affinity and the ionization potential of the second intermediate layer 7b, respectively. As described above, since the first intermediate layer 7a has an electron affinity smaller than that of the second intermediate layer 7b, electrons are more likely to move from the second light-emitting layer 6b to the third light-emitting layer 6c than from the third light-emitting layer 6c to the first light-emitting layer 6a. Since the first intermediate layer 7a has an ionization potential smaller than that of the second intermediate layer 7b, holes are more likely to move from the first light-emitting layer 6a to the third light-emitting layer 6c than from the third light-emitting layer 6c to the second light-emitting layer 6b. For this reason, in the light-emitting element 3 according to Modification Example 3 of the embodiment, electrons and holes can be efficiently accumulated in the third light-emitting layer 6c.

Examples of a combination of the first intermediate layer 7a and the second intermediate layer 7b that can be used in the light-emitting element 3 according to Modification Example 3 include the following combinations of materials.

That is, examples thereof include a combination in which the first intermediate layer 7a is MgNiO and the second intermediate layer 7b is ZnMgO, a combination in which the first intermediate layer 7a is NiO and the second intermediate layer 7b is ZnO, and a combination in which the first intermediate layer 7a is MgO and the second intermediate layer 7b is $Al_2O_3$. The combination of the material forming the first intermediate layer 7a and the material forming the second intermediate layer 7b exemplified above satisfies the relationship of the electron affinity and the ionization potential between layers of the light-emitting element 3 illustrated in FIG. 5.

As described above, in the light-emitting element 3 according to Modification Example 3 of the embodiment, electrons and holes are likely to be accumulated in the third light-emitting layer 6c. Then, electrons and holes are recombined mainly in the third light-emitting layer 6c. Since electrons and holes are recombined in the third light-emitting layer 6c separated from the hole transport layer 5 and the electron transport layer 8, occurrence of quenching can be suppressed.

In the light-emitting element 3 according to Modification Example 3 of the embodiment, light emission occurs mainly in the third light-emitting layer 6c as described above. However, in the third light-emitting layer 6c, light emission may occur on the first light-emitting layer 6a side or the second light-emitting layer 6b side of the third light-emitting layer 6c depending on a difference in mobility between holes and electrons, and the position of the center of light emission may deviate to either side.

Consequently, it is preferable that the film thickness of the third light-emitting layer 6c be made smaller than those of the first light-emitting layer 6a and the second light-emitting layer 6b so that the position of the center of light emission does not deviate as much as possible in the third light-emitting layer 6c.

The elements described in the above-described embodiments and the modification examples of the embodiments may be appropriately combined in a range in which a contradiction does not arise.

REFERENCE SIGNS LIST

2 Array substrate
3 Light-emitting element
4 Anode (first electrode)
5 Hole transport layer (first charge transport layer)
6a First light-emitting layer
6b Second light-emitting layer
6c Third light-emitting layer
7 Intermediate layer
7a First intermediate layer
7b Second intermediate layer
8 Electron transport layer (second charge transport layer)
9 Cathode (second electrode)
61 Quantum dot
100 Light-emitting device

The invention claimed is:

1. A light-emitting element comprising:
a first electrode;
a second electrode;
a first light-emitting layer and a second light-emitting layer both of which provided between the first electrode and the second electrode, both of the first light-emitting layer and the second light-emitting layer including quantum dots being the same as each other; and
an intermediate layer provided between the first light-emitting layer and the second light-emitting layer,
wherein the intermediate layer has an ionization potential larger than an ionization potential of each of the first light-emitting layer and the second light-emitting layer.

2. The light-emitting element according to claim 1,
wherein the intermediate layer further has an electron affinity smaller than an electron affinity of each of the first light-emitting layer and the second light-emitting layer.

3. The light-emitting element according to claim 1,
wherein the intermediate layer includes at least one selected from the group consisting of $Al_2O_3$, $SiO_2$, MgO, $ZrO_2$, $HfO_2$, $Cr_2O_3$, $Ga_2O_3$, $Ta_2O_5$, LiF, $BaF_2$, $CaF_2$, $MgF_2$, NaF, NaCl, $CdF_2$, $CdCl_2$, $CdBr_2$, $CdI_2$, $ZnF_2$, $ZnCl_2$, $ZnBr_2$, and $ZnI_2$, and
the first light-emitting layer and the second light-emitting layer further include at least one selected from the group consisting of a Group II-VI semiconductor compound, a Group III-V semiconductor compound, and a Group IV semiconductor compound.

4. The light-emitting element according to claim 3,
wherein the Group II-VI semiconductor compound includes at least one selected from the group consisting of MgS, MgSe, MgTe, CaS, CaSe, CaTe, SrS, SrSe, SrTe, Bas, BaSe, BaTe, ZnS, ZnSe, ZnTe, CdS, CdSe, CdTe, HgS, HgSe, and HgTe,
the Group III-V semiconductor compound includes at least one selected from the group consisting of GaAs, GaP, GaN, InN, InAs, InP, and InSb, and
the Group IV semiconductor compound includes at least one selected from the group consisting of Si and Ge.

5. The light-emitting element according to claim 1,
wherein a film thickness of the intermediate layer has a value in a range of 0.5 nm or more and 20 nm or less.

6. The light-emitting element according to claim 1, wherein the intermediate layer is formed of an inorganic material including a metal oxide or a metal halide.

7. The light-emitting element according to claim 1, wherein the first light-emitting layer is disposed closer to the first electrode than the second light-emitting layer is, the light-emitting element further comprising:

a first charge transport layer provided between the first electrode and the first light-emitting layer, the first charge transport layer including an inorganic oxide semiconductor, and a second charge transport layer provided between the second electrode and the second light-emitting layer, the second charge transport layer including another inorganic oxide semiconductor.

8. The light-emitting element according to claim 1, wherein a film thickness of each of the first light-emitting layer and the second light-emitting layer is 10 nm or more.

9. The light-emitting element according to claim 1, wherein magnitudes of the ionization potential and an electron affinity of the first light-emitting layer are equal to magnitudes of the ionization potential and an electron affinity of the second light-emitting layer, respectively.

10. A light-emitting device comprising:

a thin film transistor; and the light-emitting element according to claim 1 electrically connected to the thin film transistor.

11. A light-emitting element comprising:

a first electrode;

a second electrode;

a first light-emitting layer and a second light-emitting layer both of which provided between the first electrode and the second electrode, both of the first light-emitting layer and the second light-emitting layer including quantum dots being the same as each other; and an intermediate layer provided between the first light-emitting layer and the second light-emitting layer, wherein the intermediate layer is formed of a material not causing quenching of the quantum dots included in each of the first light-emitting layer and the second light-emitting layer.

12. The light-emitting element according to claim 11, wherein the intermediate layer is configured to suppress a conduction of charge between the first light-emitting layer and the second light-emitting layer.

13. The light-emitting element according to claim 11, wherein a film thickness of the intermediate layer has a value in a range of 0.5 nm or more and 20 nm or less.

14. A light-emitting device comprising:

a thin film transistor; and the light-emitting element according to claim 11 electrically connected to the thin film transistor.

15. A light-emitting element comprising:

a first electrode;

a second electrode;

a first light-emitting layer and a second light-emitting layer both of which provided between the first electrode and the second electrode, both of the first light-emitting layer and the second light-emitting layer including quantum dots being the same as each other; and an intermediate layer provided between the first light-emitting layer and the second light-emitting layer, wherein the first light-emitting layer and the second light-emitting layer are formed of a same material.

16. The light-emitting element according to claim 15, further comprising:

a third light-emitting layer provided between the first light-emitting layer and the second light-emitting layer, the third light-emitting layer including quantum dots being the same as the quantum dots of the first light-emitting layer and the second light-emitting layer, wherein the intermediate layer includes:

a first intermediate layer provided between the first light-emitting layer and the third light-emitting layer, and a second intermediate layer provided between the third light-emitting layer and the second light-emitting layer.

17. The light-emitting element according to claim 16, wherein the first electrode is an anode, and the second electrode is a cathode, the first light-emitting layer, the third light-emitting layer, and the second light-emitting layer are layered in this stated order from the first electrode toward the second electrode, the first intermediate layer has an electron affinity smaller than an electron affinity of each of the first light-emitting layer, the second light-emitting layer, and the third light-emitting layer, and the second intermediate layer has an ionization potential larger than an ionization potential of each of the first light-emitting layer, the second light-emitting layer, and the third light-emitting layer.

18. The light-emitting element according to claim 17, wherein the electron affinity and an ionization potential of the first intermediate layer are smaller than an electron affinity and the ionization potential of the second intermediate layer, respectively.

19. The light-emitting element according to claim 15, wherein the intermediate layer is configured to suppress a conduction of charge between the first light-emitting layer and the second light-emitting layer.

20. A light-emitting device comprising:

a thin film transistor; and the light-emitting element according to claim 15 electrically connected to the thin film transistor.

\* \* \* \* \*